(12) United States Patent
Elmallah et al.

(10) Patent No.: US 12,316,333 B2
(45) Date of Patent: May 27, 2025

(54) APPARATUS AND METHOD FOR OPTIMUM LOOP GAIN CALIBRATION FOR CLOCK DATA RECOVERY AND PHASE LOCKED LOOP

(71) Applicant: MediaTek Inc., Hsin-Chu (TW)

(72) Inventors: Ahmed Safwat Mohamed Aboelenein Elmallah, San Jose, CA (US); Mohammed Mohsen Abdulsalam Abdullatif, San Jose, CA (US); Tamer Mohammed Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 59 days.

(21) Appl. No.: 18/488,785

(22) Filed: Oct. 17, 2023

(65) Prior Publication Data

US 2024/0162906 A1    May 16, 2024

Related U.S. Application Data

(60) Provisional application No. 63/383,710, filed on Nov. 15, 2022.

(51) Int. Cl.
*H03L 7/093*    (2006.01)
*H03L 7/107*    (2006.01)

(52) U.S. Cl.
CPC .............. *H03L 7/093* (2013.01); *H03L 7/107* (2013.01); *H03L 7/1075* (2013.01); *H03L 2207/50* (2013.01)

(58) Field of Classification Search
CPC ......... H03L 7/093; H03L 7/099; H03L 7/107; H03L 7/1072; H03L 7/1075; H03L 2207/50
See application file for complete search history.

(56) References Cited

U.S. PATENT DOCUMENTS

2018/0062662 A1*    3/2018    Pake Talei ............ H03L 7/0991

* cited by examiner

*Primary Examiner* — Ryan Johnson
(74) *Attorney, Agent, or Firm* — Winston Hsu

(57) ABSTRACT

The techniques described herein relate to systems, apparatus, articles of manufacture, and methods for optimum loop gain calibration for clock data recovery and phase locked loop. An example apparatus includes a phase detector with a phase detector output and configured to generate an error signal representative of a difference between an input signal and a feedback signal. The apparatus further includes a calibrator circuit with a calibrator input coupled to the phase detector output and configured to determine correlation value associated with the error signal, and determine a gain value based on an adjustment of an absolute value of the correlation value by a pseudorandom binary sequence signal.

20 Claims, 8 Drawing Sheets

APPARATUS AND METHOD FOR OPTIMUM LOOP GAIN CALIBRATION FOR CLOCK DATA RECOVERY AND PHASE LOCKED LOOP

RELATED APPLICATION

This patent claims priority under 35 U.S.C. § 119(e) to U.S. Provisional Application No. 63/383,710, titled "METHOD FOR OPTIMUM LOOP GAIN CALIBRATION FOR CLOCK DATA RECOVERY AND PHASE LOCKED LOOP," filed on Nov. 15, 2022, which is hereby incorporated by reference herein in its entirety.

FIELD

The techniques described herein relate generally to frequency synthesizers and, more particularly, to apparatus and method for optimum loop gain calibration for clock data recovery and phase locked loop.

BACKGROUND

Receivers, such as wireline or wireless signal receivers, are devices that may receive electromagnetic signals. The electromagnetic signals may include high-frequency and low-frequency signal components. Some wireline signal receivers may use frequency synthesizers to generate a waveform at a frequency determined by analog or digital circuits. For instance, a frequency synthesizer may be an electronic device that uses an oscillator to generate a signal with a specific frequency or within a pre-set frequency range. Operation of some such frequency synthesizers may be adversely affected by component and/or system noise.

SUMMARY OF THE DISCLOSURE

Some aspects relate to an example apparatus comprising a phase detector with a phase detector output and configured to generate an error signal representative of a difference between an input signal and a feedback signal, and a calibrator circuit with a calibrator input coupled to the phase detector output and configured to determine a correlation value associated with the error signal, and determine a gain value based on an adjustment of an absolute value of the correlation value by a pseudorandom binary sequence signal.

Some aspects relate to an example calibrator circuit for loop gain calibration comprising a pseudorandom binary sequence generator with a pseudorandom binary sequence generator output and configured to generate a pseudorandom binary sequence signal. The example calibrator circuit further comprises a first multiplier circuit with a first multiplier input, a second multiplier input, and a first multiplier output, the first multiplier input is configured to receive a first signal representative of an absolute value of a correlation value associated with an error signal, the second multiplier input is coupled to the pseudorandom binary sequence generator output, and the first multiplier circuit is configured to generate a second signal based on a multiplication of the first signal and the pseudorandom binary sequence signal. The example calibrator circuit further comprises a second multiplier circuit with a third multiplier input coupled to the first multiplier output and configured to multiply the second signal by an integer to generate an output signal for generation of a gain signal, the gain signal to cause a reduction in the correlation value.

Some aspects relate to an example method comprising determining a correlation value based on an error signal and a delayed version of the error signal, determining a gain value by adjusting an absolute value of the correlation value by at least one of a pseudorandom binary sequence value or an integer value, and controlling an oscillator using the gain value.

The foregoing summary is not intended to be limiting. Moreover, various aspects of the present disclosure may be implemented alone or in combination with other aspects.

BRIEF DESCRIPTION OF FIGURES

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
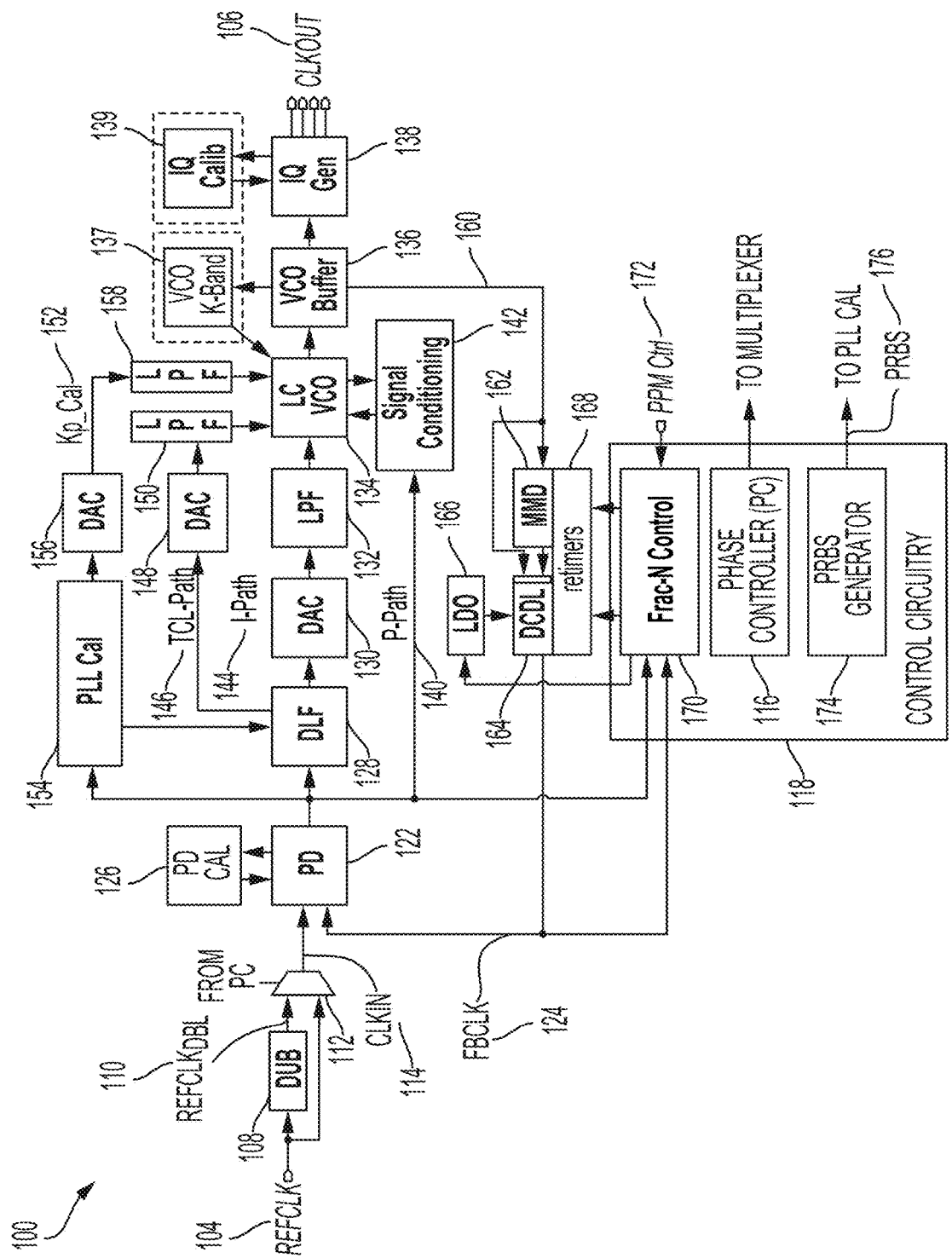
FIG. 1 depicts a schematic illustration of an example phase-locked loop including a phase-locked loop calibrator to calibrate loop gain for the phase-locked loop.

Phase-locked loop (PLL) circuits are used in a wide variety of high frequency applications. Non-limiting examples of high frequency applications include clock and data recovery (CDR), clock clean-up circuits, local oscillators (LOs) for high performance communication links, and ultrafast switching frequency synthesizers. Non-limiting examples of high-performance communication links include wireline communication links, such as Ethernet links, and wireless communication links, such as radiofrequency (RF), radar, and satellite communication links. Some PLL circuits include an oscillator (e.g., a digitally controlled oscillator (DCO), a voltage-controlled oscillator (VCO), a voltagedriven oscillator (VDO)) that adjusts (e.g., constantly adjusts) to match the frequency of an input signal. For example, some such PLL circuits may be used to generate, stabilize, modulate, demodulate, filter, or recover a signal from a communications channel from which the reception of data may be affected by noise associated with the communications channel.

In some instances, a PLL circuit can be used to perform a CDR process. For example, data may be transmitted over a communication channel without an accompanying clock signal. The PLL circuit may generate a clock from the received data. By way of example, a phase detector of the PLL circuit may receive data at a known frequency (or approximately known frequency) and output a signal that is proportional to a difference between the known frequency and a frequency of a feedback signal. The PLL circuit may generate a clock based on the proportional signal and use phase alignment to align the generated clock to the observed transitions in the received data. The generated clock and retimed data may be used by the PLL circuit or other circuitry to recover the data. The aligned clock may allow subsequently received data to be sampled at the middle of the eye to effectuate the accurate recovery of data. As used herein, the "middle of the eye" refers to the optimal point to capture a data sample. Typically, the middle of the eye has the least amount of jitter when capturing a data sample.

In some instances, the PLL circuit may include a timing error detector (TED) to perform CDR. The TED may output an error signal that is related to the difference between an unknown timing offset and an estimate of the timing offset associated with a reference signal ($F_{REF}$). In some such systems, the PLL circuit may adjust the estimate to approach the timing offset and force the error signal to zero.

One challenge of using a PLL circuit with an oscillator to perform CDR is that the oscillator may introduce substantial noise into the PLL circuit, and/or, more generally, into a system that includes the PLL circuit. In some systems, the oscillator noise may be converted to coupled spurs at one or more frequencies, which can shift a sampling instant of $F_{REF}$. By shifting the sampling instance of $F_{REF}$, the sampling of F REF can be degraded and cause erroneous operation of the PLL circuit.

A loop gain associated with the PLL may be adjusted to mitigate and/or reduce the noise from the oscillator. For a PLL that includes a TED, for example, the TED equivalent gain may depend on parameters such as data rate, used channel, and the tuned frequency of the receiver front end (RXFE TF). However, such parameters may be challenging to measure or estimate accurately and can be time varying due to temperature variations. Identifying an optimized and/or otherwise improved loop gain, such as a TED gain, may achieve improved performance of an associated serializer-deserializer (SerDes). Beneficially, performing TED gain calibration in an accurate and fast manner can achieve improved bit error rates and improved performance across process, voltage, and temperature (PVT) variations.

One challenge of adjusting a PLL loop gain is that the size of the loop gain may result in slow error correction. For example, if the PLL loop gain is relatively too small, the corresponding error correction of the PLL is likewise relatively small. Slow error correction may result in many residual errors with the same polarity, which can result in an autocorrelation of the error signals to be continuously positive and cause erroneous operation of the error correction circuit. By way of another example, if the PLL loop gain is relatively too large, the corresponding error correction of the PLL is likewise relatively too large. Overcorrection can cause subsequent samples to have the opposite polarity and thereby cause the autocorrelation of the error signals to alternate between positive and negative. Such large swings from one direction to the next can cause erroneous operation of the error correction circuit.

The inventors have recognized that the aforementioned challenges have not been overcome by using conventional techniques, such as by adjusting a PLL loop gain. To overcome the deficiencies of the conventional techniques, the inventors have developed technology for optimum loop gain calibration for clock data recovery and phase locked loop. In some embodiments, samples can be randomized such that a correlation (e.g., an autocorrelation) of TED and/or phase detector (PD) outputs can approach zero to achieve an optimum loop gain of the PLL. For example, a PLL calibrator can be used to inject a pseudorandom binary sequence (PRBS) signal to randomize a sample, such as an output from a TED or PD. Additionally or alternatively, the PLL calibrator may be used to inject a fully random binary sequence signal to randomize and/or further randomize the sample. In some embodiments, by randomizing the sample, the correct direction that can minimize and/or otherwise reduce the absolute value of the correlation (e.g., the autocorrelation) of the sample can be identified. In some embodiments, after determining the correct direction, the change in the loop gain, and/or, more generally, the loop gain, can be effectuated in the PLL.

Turning to the figures, the illustrated example of FIG. 1 depicts a schematic illustration of an example phase-locked loop (PLL) 100 including a phase-locked loop calibrator 154 (identified by PLL CAL) to calibrate a loop gain for the phase-locked loop 100. The PLL 100 is a circuit (e.g., a PLL circuit) that generates an output clock signal 106 (identified by CLKOUT) whose phase is related to a phase of a reference clock signal 104 (identified by REFCLK). For example, the PLL 100 can synchronize and/or lock a phase of the output clock signal 106 with a phase of the reference clock signal 104. In some embodiments, the PLL calibrator 154 can adjust, calibrate, change, and/or modify the loop gain of the PLL 100 such that the phase of the output clock signal 106 is synchronized and/or locked with the phase of the reference clock signal 104. In some embodiments, the PLL 100, or portion(s) thereof, can implement a frequency synthesizer that produces a range of frequencies from a single fixed oscillator.

In the illustrated example, the reference clock signal 104 is an input signal that can be transmitted by a transmitter and/or received by a receiver. For example, the PLL 100 can be configured to receive the reference clock signal 104 from a wireline receiver, such as a data communication wireline receiver. Non-limiting examples of wireline receivers include Ethernet interfaces, Peripheral Component Interconnect (PCI) interfaces, Serial Digital Interfaces (SDI), Universal Serial Bus (USB) interfaces, and High-Definition Multimedia Interfaces (HDMI). Alternatively, the PLL 100 can be configured to receive the reference clock signal 104 from a wireless receiver. Non-limiting examples of wireless receivers include Wireless Fidelity (Wi-Fi) receivers, Bluetooth receivers, near-field communication (NFC) receivers, radio-frequency identification (RFID) receivers, and satellite receivers (e.g., beyond-line-of-site (BLOS) satellite receivers, line-of-site (LOS) satellite receivers, etc.).

In some embodiments, the PLL 100 is included in and/or associated with an electronic device. Non-limiting examples of electronic devices include gateways, routers, switches, laptop computers, tablet computers, cellular phones (e.g., smartphones), televisions (e.g., smart televisions), set-top boxes, streaming devices, and wearable devices (e.g., headphones, headsets, smartwatches, smart glasses, etc.). For example, the output clock signal 106 can be provided to additional circuitry, such as a transmitter, a receiver, and/or a programmable processor. Non-limiting examples of programmable processors include central processing units (CPUs), digital signal processors (DSPs), graphics processing units (GPUs), and field programmable gate arrays (FPGAs).

The PLL 100 of the illustrated example includes a frequency doubler 108 (identified by DUB) to double and/or otherwise increase a frequency (e.g., a reference clock frequency, an input clock frequency) of the reference clock signal 104 to generate a doubled reference clock signal 110 (identified by REFCLK DBL). In some embodiments, the frequency doubler 108 is a frequency doubler circuit that increases the frequency of the reference clock signal 104 to increase a bandwidth of the PLL 100. In some embodiments, the frequency doubler 108 is implemented by an oscillator (e.g., a reference oscillator, an oscillator circuit) to increase the frequency of the reference clock signal 104. In some embodiments, the frequency doubler 108 can be configured to receive the reference clock signal 104 from a receiver (e.g., a wireline receiver, a wireless receiver). Alternatively, the PLL 100 may utilize a different frequency increaser than the frequency doubler 108 to triple, quadruple, etc., the reference clock signal 104.

The PLL 100 of the illustrated example includes a multiplexer 112 configured to output one of the reference clock signal 104 or the doubled reference clock signal 110 as an input clock signal 114 (identified by CLKIN). The multiplexer 112 can select one of its inputs in response to a control signal from a phase controller 116, and/or, more generally, from control circuitry 118. The multiplexer 112 has a first input (e.g., a first multiplexer input) coupled to an output (e.g., a doubler output, a frequency doubler output) of the frequency doubler 108. The multiplexer 112 has a second input (e.g., a second multiplexer input) configured to receive the reference clock signal 104.

The PLL 100 of the illustrated example includes a phase detector 122 (identified by PD and may also be referred to as a phase comparator or mixer) to compare a first phase of the input clock signal 114 and a second phase of a feedback clock signal 124 (identified by FBCLK). The feedback clock signal 124 can be a delayed instance of the output clock signal 106. In some embodiments, the PD 122 can be a phase detector circuit that can generate and/or output a voltage according to a phase difference of the first and second phases. In some embodiments, the voltage can be an error signal that is representative of an error that is detected between the phases of the input clock signal 114 and the feedback clock signal 124.

In some embodiments, the PD 122 can include and/or be implemented by a time-to-digital converter (TDC). For example, the PD 122 can be configured to measure the time between a start event, such as a rising or falling edge of a first pulse, and a stop event, such as a rising or falling edge of a second pulse. In some embodiments, the PD 122 can include and/or be implemented by a timing error detector (TED). For example, the PD 122 can be configured to generate and/or output an error signal related to the difference between an unknown timing offset and an estimate of a timing offset. Non-limiting examples of TEDs include decision-directed TEDs and non-data-aided TEDs. Non-limiting examples of decision-directed TEDs include a zero-crossing TED and a Mueller-Muller TED. Non-limiting examples of non-data-aided TEDs include a Gardner TED and an early-late TED.

The PD 122 of the illustrated example has a first input (e.g., a first detector input, a first phase detector input) coupled to an output (e.g., a multiplexer output) of the multiplexer 112. For example, the multiplexer 112 and the PD 122 can be coupled together through one or more electrical connections. Non-limiting examples of electrical connections include opto-isolators, pads, traces, wires, and vias.

In some embodiments, the PD 122 can be calibrated by a phase detector calibrator (identified by PD CAL) 126. For example, the phase detector calibrator 126 can be a phase detector calibrator circuit (or phase detector calibration circuit) configured to calibrate the PD 122 to mitigate and/or reduce the effects of process, variation, and temperature (PVT) variances. In some embodiments, the phase detector calibrator 126 can adjust, modify, and/or calibrate the PD 122 to align with a predetermined operation of the PD 122. Output(s) of the PD 122 is/are coupled to input(s) (e.g., phase detector calibrator input(s)) of the phase detector calibrator 126. Input(s) of the PD 122 is/are coupled to output(s) (e.g., phase detector calibrator output(s)) of the phase detector calibrator 126.

The PLL 100 of this example includes a digital loop filter 128 (identified by DLF). In some embodiments, the DLF 128 is implemented by digital logic that can convert the output of the PD 122 into a digital control signal for a voltage-controlled oscillator 134 (identified by LC VCO) of the PLL 100. For example, the PD 122 can be implemented by one or more charge pumps that can output a current representative of the detected error. In some such embodiments, the DLF 128 can convert the current from the one or more charge pumps to a digital signal that represents a control voltage for the LC VCO 134. Alternatively, the PD 122 may output a voltage representative of the detected error. In some embodiments, the DLF 128 can filter out and/or attenuate noise coming from the input clock signal 114 to the control voltage. The DLF 128 of the illustrated example has an input (e.g., a filter input, a loop filter input, a digital loop filter input) coupled to an output of the PD 122.

The PLL 100 of the illustrated example includes a first digital-to-analog converter 130 (identified by DAC) and a first low-pass filter 132 (identified by LPF). In some embodiments, the first DAC 130 can be configured to convert the digital signal from the DLF 128 into an analog signal, such as a voltage signal. The first LPF 132 can implement a low-pass filter to allow frequencies below a cutoff frequency to pass to the LC VCO 134 while attenuating frequencies above the cutoff frequency. Input(s) (e.g., DAC input(s)) of the first DAC 130 is/are coupled to output(s) of the DLF 128. Output(s) (e.g., DAC output(s)) of the first DAC 130 is/are coupled to input(s) (e.g., filter input(s), LPF input(s)) of the first LPF 132.

The PLL 100 of this example includes the LC VCO 134 to generate and/or output an oscillatory signal according to the control voltage output from the LPF 132. The oscillatory signal can be used to generate the output clock signal 106. The LC VCO 134 of this example is a low power, low phase-noise Inductance Capacitance voltage controlled oscillator (LC VCO). In some embodiments, the LC VCO 134 is a VCO circuit (e.g., a LC VCO circuit) that generates and/or outputs the oscillatory signal. Input(s) (e.g., VCO input(s), LC VCO input(s)) of the LC VCO 134 is/are coupled to output(s) (e.g., filter output(s), LPF output(s)) of the LPF 132.

In the illustrated example, the PLL 100 includes a buffer 136 (identified by VCO BUFFER). The buffer 136 of this example is a buffer that can be configured to receive and buffer the oscillatory signal from the LC VCO 134. Input(s) (e.g., buffer input(s), VCO buffer input(s)) of the VCO buffer 136 is/are coupled to output(s) (e.g., VCO output(s), LC VCO output(s)) of the LC VCO 134. Optionally, the PLL 100 may include digital logic 137 (identified as VCO K-Band) configured to control the LC VCO 134 to operate in one or more wireless bands, such as the K-band.

The PLL 100 of this example includes an in-phase and quadrature (IQ) generator (identified by IQ GEN) 138. The IQ generator 138 can be configured to generate and/or output the output clock signals 106 based on the oscillatory signal from the LC VCO 134 via the VCO buffer 136. In some embodiments, the output clock signals 106 are oscillatory signals, such as sinusoidal signals, that have the same frequency but different phases. For example, respective ones of the output clock signals 106 can be 90 degrees out of phase with each other. Alternatively, respective ones of the output clock signals 106 may be a different number of degrees out of phase with each other. Input(s) (e.g., IQ generator input(s)) of the IQ generator 138 is/are coupled to output(s) (e.g., buffer output(s), VCO buffer output(s)) of the VCO buffer 136. Output(s) of the IQ generator 138 can be coupled to additional circuitry, such as a transmitter, a receiver, and/or a programmable processor. Optionally, the PLL 100 may include digital logic 139 (identified as IQ Calib) configured to calibrate the IQ generator 138.

The PLL 100 of the illustrated example includes a plurality of control paths, such as digital control paths, to control the PLL 100, or portion(s) thereof. For example, the plurality of control paths can implement a control system, such as a digital control system, or portion(s) thereof. In some embodiments, one(s) of the plurality of control paths can be used to determine and/or adjust a loop gain of the PLL. For example, one(s) of the plurality of control paths can implement a Proportional-Integral-Derivative (PID) controller. In some embodiments, one(s) of the plurality of control paths can implement a Proportional-Integral (PI) controller. A first example control path 140 of FIG. 1 is a P-Path, which includes at least the PD 122 and a signal conditioning circuit 142. Optionally, the P-Path may include the PLL calibrator 154. Input(s) (e.g., signal conditioning input(s)) of the signal conditioning circuit 142 is/are coupled to output(s) of the PD 122. Output(s) (e.g., signal conditioning output(s)) of the signal conditioning circuit 142 is/are coupled to input(s) of the LC VCO 134. In some embodiments, the P-Path 140 determines and/or outputs a Proportional (P) parameter, such as a P-control (P-CTRL) parameter.

A second example control path 144 of FIG. 1 is an I-Path, which includes at least the PD 122, the DLF 128, the first DAC 130, and the first LPF 132. Optionally, the I-Path may include the PLL calibrator 154. In some embodiments, the I-Path 144 determines and/or outputs an Integral (I) parameter, such as an I-control (I-CTRL) parameter, which can be used by the LC VCO 134 to generate an oscillatory signal.

A third example control path 146 of FIG. 1 is a closed-loop response time path (TCL-Path), which includes at least the PD 122, the DLF 128, a second DAC 148, and a second LPF 150. Optionally, the TCL-Path may include the PLL calibrator 154. In some embodiments, the TCL-Path 146 determines and/or outputs a TCL parameter, such as an TCL-control parameter, which can be used by the LC VCO 134 to generate an oscillatory signal. For example, the TCL parameter can be used to adjust, change, and/or modify a closed loop response time of the PLL 100, or portion(s) thereof.

A fourth example control path 152 of FIG. 1 is a Proportional control calibration path (Kp_Cal), which includes at least the PD 122, a PLL calibrator 154, a third DAC 156, and a third LPF 158. In some embodiments, the Kp_Cal Path 152 determines and/or outputs a Kp_Cal parameter, which can be used by the LC VCO 134 to generate an oscillatory signal. For example, the Kp_Cal parameter can be used to adjust, calibrate, change, and/or modify the P parameter. In some embodiments, the PLL calibrator 154 can be implemented with digital logic.

In the illustrated example, the PLL 100 includes and/or implements a feedback path 160 configured to cause the generation of the feedback clock signal 124. The feedback path 160 includes a multi-modulus divider 162 (identified by MMD) to divide and/or reduce a frequency of the oscillatory signal from the LC VCO 134. Additionally or alternatively, a pre-division ratio may be included in the PLL 100 prior to the MMD 162. In some embodiments, the MMD 162 can be an MMD circuit that divides a frequency of the oscillatory signal by a divisor (e.g., 2, 3, 4, etc.) to generate a divided clock signal. For example, the MMD 162 can be implemented using one or more analog and/or digital circuits configured to divide the frequency of the oscillatory signal. In some embodiments, the MMD 162 can delay the divided clock signal by a time delay (e.g., a time duration, a time period) in a time delay range to generate a delayed clock signal. For example, time delays in the time delay range can range from zero time delay to a time delay up to at least a period of the LC VCO 134 (e.g., Tyco, $T_{LCVCO}$). Any other time delay range may be utilized. The MMD 162 of this example has input(s) (e.g., divider input(s), MMD input(s)) coupled to output(s) of the LC VCO 134.

The feedback path 160 of the illustrated example includes a digitally controlled delay line (DCDL) 164 to delay the output, such as a divided clock signal, from the MMD 162, by a time delay in a time delay range to generate the feedback clock signal 124. In some embodiments, the DCDL 164 can cause a reduction of a difference (e.g., a difference in phases) of the input clock signal 114 and the feedback clock signal 124. In some embodiments, the DCDL 164 is implemented by one or more analog and/or digital circuits. For example, the DCDL 164 can be implemented by one or more buffers (e.g., circular buffers) that implement one or more discrete digital logic elements. Alternatively, the DCDL 164 may be implemented by any other analog and/or digital components or elements.

The DCDL 164 of this example has input(s) (e.g., delay input input(s), DCDL input(s)) coupled to output(s) (e.g., divider output(s), MMD output(s)) of the MMD 162. Input (s) of the DCDL 164 is/are coupled to output(s) of a low dropout (LDO) circuit 166, which can be configured to regulate an output voltage (to the DCDL 164) that is powered from a higher-voltage input.

Output(s) (e.g., delay line output(s), DCDL output(s)) of the DCDL 164 is/are coupled to input(s) of the PD 122. Alternatively, one or more portions of the DCDL 164 may be disposed elsewhere in the PLL 100. For example, a first portion of the DCDL 164 can be in circuit with a reference path of the PLL 100, which can be a path that includes at least one of the frequency doubler 108 or the PD 122. In some embodiments, a second portion of the DCDL 164 can be in circuit with the feedback path 160.

The feedback path 160 of this example includes one or more retimers 168. The one or more retimers 168 can be respectively configured to delay the output signal from at least one of the MMD 162 or the DCDL 164. For example, the one or more retimers 168 can be implemented using one or more analog and/or digital circuits configured to delay and/or retime the signal outputs from at least one of the MMD 162 or the DCDL 164.

In some embodiments, the MMD 162, the DCDL 164, the one or more retimers 168, and/or, more generally, the PLL 100, can be configured to cause generation of the feedback clock signal 124 to reduce the error associated with the input clock signal 114. For example, the PLL 100 includes the control circuitry 118, which can be implemented by one or more control circuits, to configure at least one of the MMD 162, the DCDL 164, or the one or more retimers 168 to reduce a difference between the input clock signal 114 and the feedback clock signal 124. In some embodiments, the reduction of the difference can be implemented by shifting the feedback clock signal 124 to have the same error as the input clock signal 114. In some embodiments, the control circuitry 118 is implemented by one or more digital components, circuits, and/or, more generally, digital logic.

In the illustrated example, the control circuitry 118 has a first input (e.g., a first control input) coupled to an output (e.g., a PD output) of the PD 122. In this example, the control circuitry 118 has a second input (e.g., a second control input) coupled to an output (e.g., a DCDL output) of the DCDL 164. In this example, a first output (e.g., a first control output) of the control circuitry 118 is coupled to an input (e.g., an MMD input) of the MMD 162. In this example, a second output (e.g., a second control output) of the control circuitry 118 is coupled to an input (e.g., a DCDL input) of the DCDL 164. In this example, a third output (e.g., a third control output) of the control circuitry 118 is coupled to an input (e.g., a retimer input) of one(s) of the one or more retimers 168. In this example, a fourth output (e.g., a fourth control output) of the control circuitry 118 is coupled to an input (e.g., an LDO input) of the LDO circuit 166.

In the illustrated example, the control circuitry 118 implements fractional-N (Frac-N) control logic 170. In some embodiments, the control circuitry 118 can be digital logic and/or implemented at least in part by digital logic to effectuate Frac-N control. For example, the Frac-N control logic 170 can effectuate the programmable divider functionality of the MMD 162. In the illustrated example, the Frac-N control logic 170 can output control signals representative of N or N+1 such that the MMD 162 divides the output signal from the LC VCO 134 by N or N+1.

In some embodiments, the Frac-N control logic 170 and/or, more generally, the control circuitry 118, can receive first control signal(s) 172 (identified by PPM Control), such as digital code(s) (e.g., digital code word(s)), to set an initial configuration of the Frac-N control logic 170 and/or, more generally, the control circuitry 118. The control circuitry 118 of this example includes a PRBS generator 174, which can be configured to generate a second control signal 176 (identified by PRBS). In some embodiments, the second control signal 176 is a pseudorandom binary sequence (PRBS) signal generated by the PRBS generator 174. For example, the PRBS generator 174 can generate and/or output the second control signal 176.

In some embodiments, the PRBS generator 174 can be implemented by one or more analog circuits and/or one or more digital circuits configured to generate signals based on pseudorandom binary sequences (also referred to as pseudorandom binary codes, pseudorandom bitstreams, or deterministic random bitstreams). Pseudorandom binary sequences are binary sequences that are generated by a deterministic algorithm but are difficult to predict and can exhibit statistical behavior similar to a truly random sequence. In some embodiments, the pseudorandom binary sequences can be generated by a pseudorandom number generator (PRNG) (also referred to as a deterministic random bit generator), which can implement the PRBS generator 174. For example, the PRBS generator 174 can execute, instantiate, and/or implement a function (e.g., a firmware and/or embedded software function), a program (e.g., a firmware and/or embedded software program), etc., and/or any combination(s) thereof, that may perform and/or carry out an algorithm to simulate randomness. In some embodiments, the algorithm may have one or more inputs referred to as "seeds" and outputs a sequence of values (e.g., a binary sequence of one or more bits) that appears to be random. In some embodiments, the seeds may be unknown, which can cause the output(s) of the algorithm to be unpredictable and effectuate the randomness and/or pseudo randomness property of the algorithm. Additionally or alternatively, the control circuitry 118 may generate a control signal, such as a fully random signal based on a fully random binary sequence.

In some embodiments, the control circuitry 118 can be configured to receive the error signal from the PD 122. For example, the control circuitry 118 can determine whether the error signal is greater than or less than a voltage threshold (e.g., 0 volts (V), 0.5 V, etc.) for each clock cycle of the PD 122. In some embodiments, the control circuitry 118 can generate a first digital code based on the error signal and output the first digital code to the MMD 162 to change a configuration of the MMD 162. The configuration of the MMD 162 can cause a change (e.g., an increase, a decrease) in a time delay that the MMD 162 applies to the output clock signal 106. In some embodiments, the control circuitry 118 can generate a second digital code based on the error signal and output the second digital code to the DCDL 164 to change a configuration of the DCDL 164. The configuration of the DCDL 164 can cause a change (e.g., an increase, a decrease) in a time delay that the DCDL 164 applies to the delayed clock signal from the MMD 162.

Beneficially, in some embodiments, Frac-N control and DCD calibration can be combined and/or merged to improve operation of a frequency synthesizer, such as at least part of the PLL 100. For example, Frac-N control and DCD calibration can be combined and/or merged to improve locking of the phases of the reference clock signal 104 and the feedback clock signal 124.

While an example implementation of the PLL 100 is depicted in FIG. 1, other implementations are contemplated. For example, one or more blocks, components, functions, etc., of the PLL 100 may be combined or divided in any other way. The PLL 100 of the illustrated example may be implemented by hardware alone, or by a combination of hardware, software, and/or firmware. For example, the PLL 100 may be implemented by one or more analog circuits (e.g., capacitors, comparators, diodes, inductors, operational amplifiers, resistors, transistors, etc.), one or more digital circuits (e.g., logic gates, etc.), one or more hardware-implemented state machines, one or more programmable processors, one or more application specific integrated circuits (ASICs), etc., and/or any combination(s) thereof. The PLL 100 of the illustrated example can be implemented by one or more integrated circuits (ICs) on the same die or two or more different dies. For example, a first set of one or more blocks, components, functions, etc., of the PLL 100 can be implemented by one or more first ICs on a first die and a second set of one or more blocks, components, functions, etc., of the PLL 100 can be implemented by one or more second ICs on a second die. In some such embodiments, one or more blocks, components, functions, etc., of the first set are different from one or more blocks, components, functions, etc., of the second set.

Figure 2:
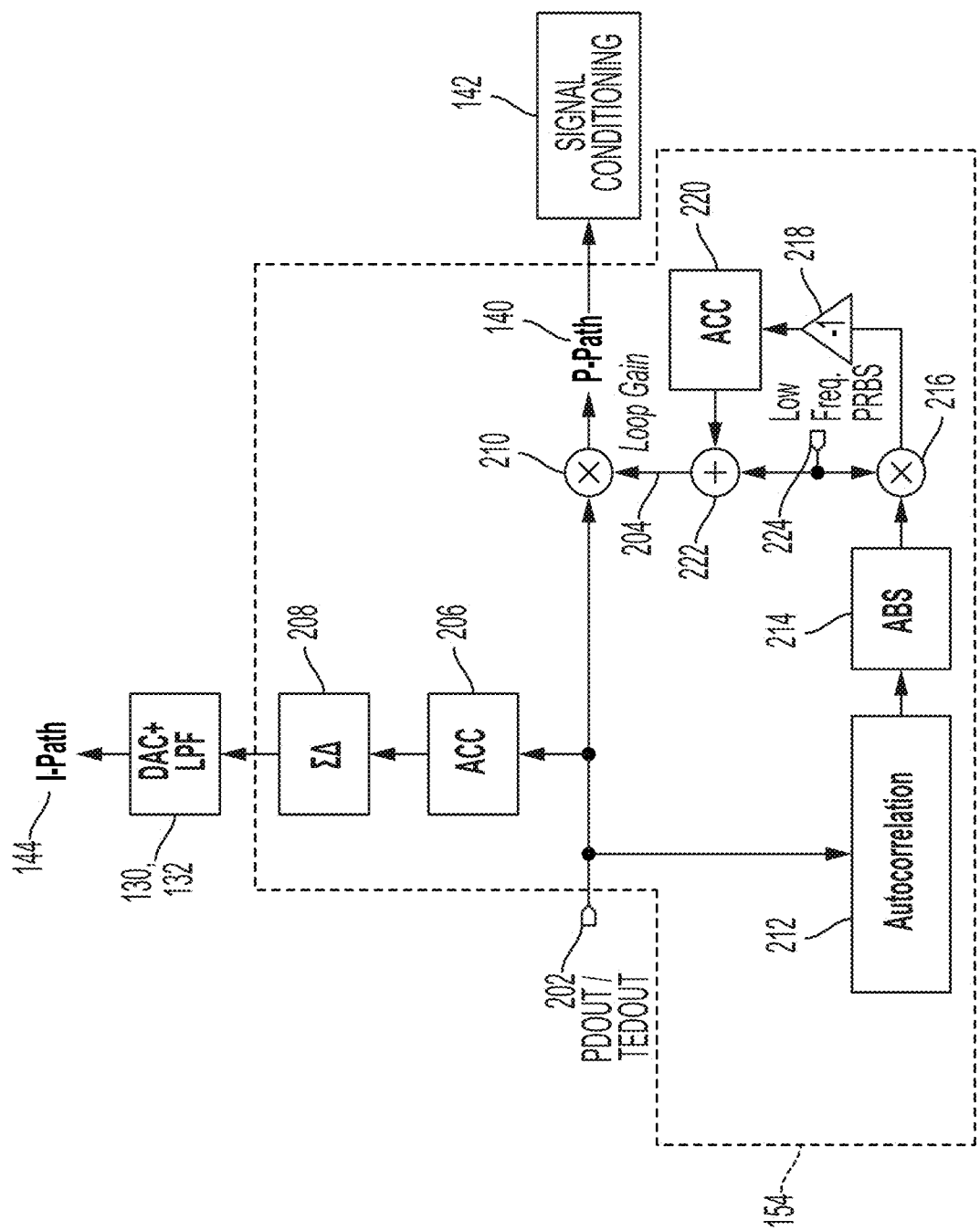
FIG. 2 depicts a schematic illustration of an example portion of the phase-locked loop of FIG. 1 and an example implementation of the phase-locked loop calibrator of FIG. 1.

FIG. 2 depicts a schematic illustration of an example portion of the PLL 100 of FIG. 1 and an example implementation of the PLL calibrator 154 of FIG. 1. In the illustrated example, the PLL calibrator 154 can be configured to receive a signal from a first input/output (I/O) port 202 identified by PDOUT/TEDOUT. For example, the first I/O port 202 can be configured to receive an output signal, such as a first output (TEDOUT) from a timing error detector (TED) and/or a second output (PDOUT) from a phase detector, such as the PD 122 of FIG. 1.

The PLL calibrator 154 can be configured to adjust, change, and/or modify a loop gain 204 of a PLL, such as the PLL 100 of FIG. 1. For example, the PLL calibrator 154 can be configured to adjust the loop gain 204 such that the absolute of the correlation of the PD output and/or the TED output can be minimized and/or otherwise reduced. In some embodiments, the correlation of the PD output and/or the TED output is an autocorrelation, which can be represented by an autocorrelation value.

The PLL calibrator 154 of this example is coupled to an I-Path and a P-Path, which can be the I-Path 144 and the P-Path 140, respectively, of FIG. 1. For example, the PLL calibrator 154 can include a first accumulator 206 (identified by ACC) and a first sigma-delta modulator 208 (identified by ΣΔ) to be coupled to the first DAC 130 and the first LPF 132 of the I-Path 144 of FIG. 1. The PLL calibrator 154 can include a first multiplier 210 to be coupled to the signal conditioning circuit 142 of the P-Path 140 of FIG. 1. In some embodiments, the P-Path of FIG. 2 can combine and/or integrate the P-Path 140 and the Kp_Cal Path 152 of FIG. 1.

The PLL calibrator 154 of the illustrated example can multiply the gain of the P-Path (e.g., the P-Path 140 of FIG. 1, a combination of the P-Path 140 and the Kp_Cal Path 152) with the loop gain 204 in the digital domain. The PLL calibrator 154 includes autocorrelation logic 212, absolute value determination logic 214 (identified by ABS), a second multiplier 216, a third multiplier 218, a second accumulator 220 (identified by ACC), an adder 222, and a second I/O port 224.

In some embodiments, the autocorrelation logic 212 can be configured to determine and/or output a correlation value, such as an autocorrelation value, of the output signal from the first I/O port 202. Additionally or alternatively, the autocorrelation logic 212 can be configured to determine any other parameter and/or value representative of a relationship of the output signal and a delayed version and/or otherwise altered version of the output signal. For example, the autocorrelation logic 212 can be configured to determine a correlation (e.g., an autocorrelation) of the output signal with itself, such as a time delayed version of the output signal. The absolute value determination logic 214 can be configured to determine an absolute value of the autocorrelation value from the autocorrelation logic 212. The second multiplier 216 can be configured to multiply the absolute value of the autocorrelation value and a PRBS signal (identified by LOW FREQ PRBS) from the second I/O port 224 to generate a first output signal. For example, the PRBS signal can be implemented by and/or correspond to the PRBS signal 176 of FIG. 1. In some embodiments, the PRBS signal can be either a −1 or a +1 signal such that the second multiplier 216 can change a sign of the absolute value of the autocorrelation value in a pseudorandom manner. The third multiplier 218 of this example can be configured to multiply the first output signal from the second multiplier 216 by an integer to generate a second output signal. In the illustrated example, the integer is −1. Alternatively, the third multiplier 218 can be configured to multiply the first output signal via any other integer (e.g., −3, −2, 0, +1, +2, etc.).

The second accumulator 220 of this example can be configured to store a value representative of the second output signal. The second accumulator 220 can be configured to output the value to the adder 222. The adder 222 can be configured to determine a combination, such as a sum, of the stored value from the second accumulator 220 and a value representative of the PRBS signal (e.g., −1 or +1).

In the illustrated example, the adder 222 and/or, more generally, the PLL calibrator 154, can calculate and/or determine the loop gain 204 based on a combination, such as a sum, of the stored value from the second accumulator 220 and the value representative of the PRBS signal. For example, the adder 222 can inject a perturbation from the PRBS generator 174 of FIG. 1 such that the absolute value of the autocorrelation value can alternate in values (e.g., if the absolute value of the autocorrelation value is +6, then the injected perturbation can change the value thereof to be +5 or +7). The first multiplier 210 can adjust, change, and/or modify the gain effectuated by the P-Path 140 by multiplying the output signal from the first I/O port 202 and the loop gain 204. The gain effectuated by the P-Path 140 can thereby result in pulses that may be subsequently converted into amplitudes (e.g., voltage amplitudes) by the signal conditioning circuit 142 and/or other circuitry such as the LC VCO 134 of FIG. 1. For example, the P-Path 140 can output pulses representative of a gain, which can be based on the loop gain 204, such that the gain of the LC VCO 134 can be adjusted, changed, and/or modified for improved operation of the PLL 100 of FIG. 1.

Figure 3:
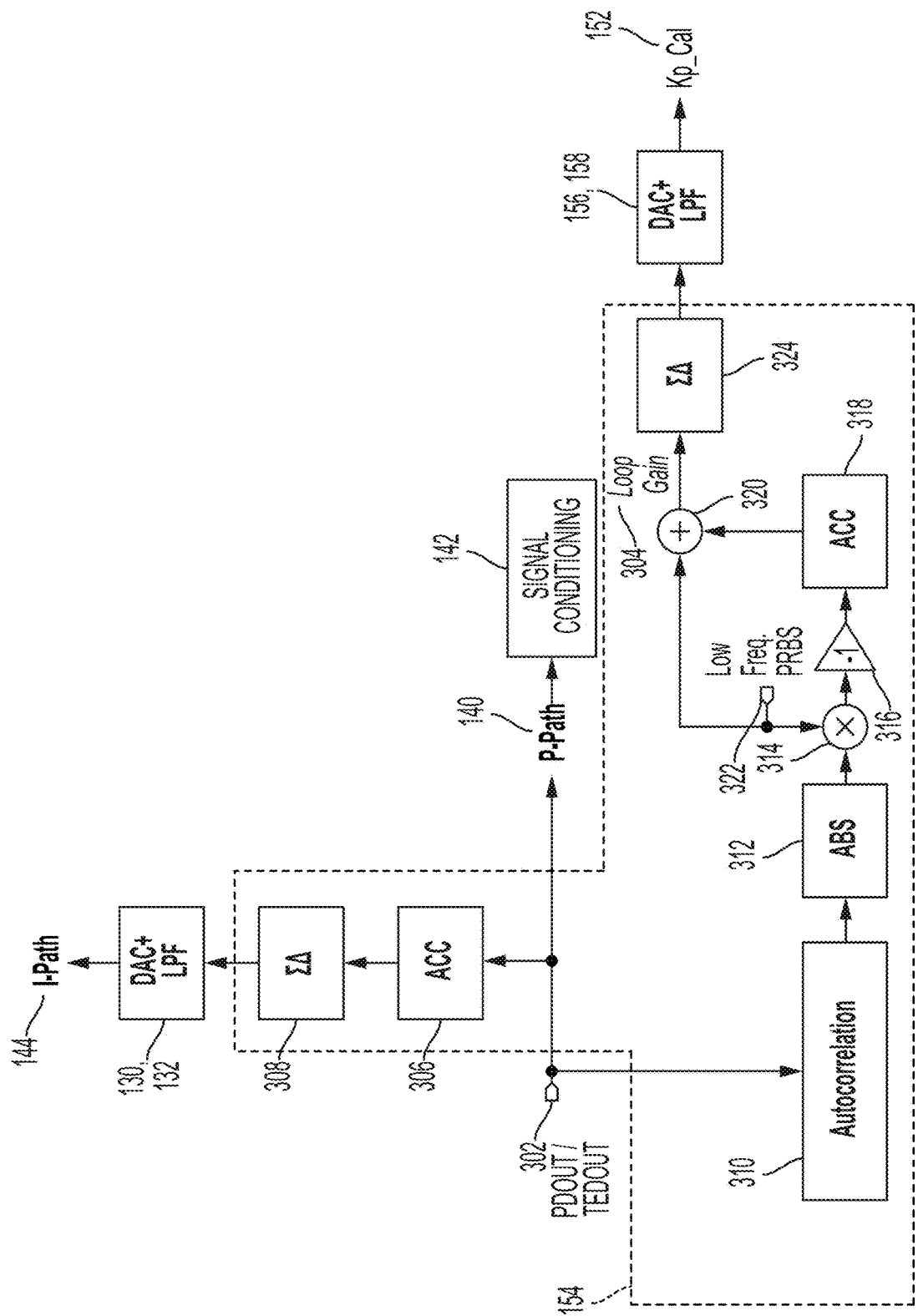
FIG. 3 depicts a schematic illustration of an example portion of the phase-locked loop of FIG. 1 and another example implementation of the phase-locked loop calibrator of FIG. 1.

FIG. 3 depicts a schematic illustration of an example portion of the PLL 100 of FIG. 1 and another example implementation of the PLL calibrator 154 of FIG. 1. In the illustrated example, the PLL calibrator 154 can be configured to receive a signal from a first input/output (I/O) port 302 identified by PDOUT/TEDOUT. For example, the first I/O port 302 can be configured to receive an output signal, such as a first output (TEDOUT) from a timing error detector (TED) and/or a second output (PDOUT) from a phase detector, such as the PD 122 of FIG. 1.

The PLL calibrator 154 can be configured to adjust, change, and/or modify a loop gain 304 of a PLL, such as the PLL 100 of FIG. 1. For example, the PLL calibrator 154 can be configured to adjust the loop gain 304 such that the absolute of the autocorrelation of the PD output and/or the TED output can be minimized and/or otherwise reduced.

The PLL calibrator 154 of this example is coupled to an I-Path, a P-Path, and a Kp_Cal Path, which can be the I-Path 144, the P-Path 140, and the Kp_Cal Path 152, respectively, of FIG. 1. For example, the PLL calibrator 154 can include a first accumulator 306 (identified by ACC) and a first sigma-delta modulator 308 (identified by ΣΔ) to be coupled to the first DAC 130 and the first LPF 132 of the I-Path 144 of FIG. 1. The first I/O port 302 can be coupled to the signal conditioning circuit 142 of the P-Path 140 of FIG. 1. In the illustrated example, the P-Path is separate from the Kp_Cal Path.

The PLL calibrator 154 includes autocorrelation logic 310, absolute value determination logic 312 (identified by ABS), a first multiplier 314, a second multiplier 316, a second accumulator 318 (identified by ACC), an adder 320, and a second I/O port 322. In some embodiments, the autocorrelation logic 310 can be configured to determine and/or output an autocorrelation value of the output signal from the first I/O port 302. For example, the autocorrelation logic 310 can be configured to determine a correlation of the output signal with itself, such as a time delayed version of the output signal. The absolute value determination logic 312 can be configured to determine an absolute value of the autocorrelation value from the autocorrelation logic 310. The first multiplier 314 can be configured to multiply the absolute value of the autocorrelation value and a PRBS signal (identified by LOW FREQ PRBS) from the second I/O port 322 to generate a first output signal. For example, the PRBS signal can be implemented by and/or correspond to the PRBS signal 176 of FIG. 1. In some embodiments, the PRBS signal can be either a −1 or a +1 signal such that the second multiplier 216 can change a sign of the absolute value of the autocorrelation value in a pseudorandom manner. The second multiplier 316 of this example can be configured to multiply the first output signal from the first multiplier 314 by an integer to generate a second output signal. In the illustrated example, the integer is −1. Alternatively, the second multiplier 316 can be configured to multiply the first output signal via any other integer (e.g., −3, −2, 0, +1, +2, etc.).

The second accumulator 318 of this example can be configured to store a value representative of the second output signal. The second accumulator 318 can be configured to output the value to the adder 320. The adder 320 can be configured to determine a combination, such as a sum, of the stored value from the second accumulator 318 and a value representative of the PRBS signal (e.g., −1 or +1).

In the illustrated example, the adder 320 and/or, more generally, the PLL calibrator 154, can calculate and/or determine the loop gain 304 based on a combination, such as a sum, of the stored value from the accumulator 318 and the value representative of the PRBS signal. For example, the adder 320 can inject a perturbation from the PRBS generator 174 of FIG. 1 such that the absolute value of the autocorrelation value can alternate in values (e.g., if the absolute value of the autocorrelation value is +6, then the injected perturbation can change the value thereof to be +5 or +7). The adder 320 can adjust, change, and/or modify the gain effectuated by the Kp_Cal Path 152 by adding the output signal from the second I/O port 322 and the stored value from the second accumulator 318. The adder 320 of this example can output a signal representative of the loop gain 304 to a second sigma-delta modulator 324 (identified by ΣΔ). The second sigma-delta modulator 324 can be configured to provide an output to the third DAC 156 and the third LPF 158 of FIG. 1.

In some embodiments, the P-Path 140 can be a fast path such that a gain provided by the P-Path 140 affects operation of the LC VCO 134 faster than the loop gain 304 provided by the Kp_Cal Path 152. For example, the Kp_Cal Path 152 can be a slower path compared to the P-Path 140 such that the Kp_Cal Path 152 affects operation of the LC VCO 134 slower (e.g., a slower response time) compared to the P-Path 140. In some embodiments, a first gain provided by the P-Path 140 changes and/or updates faster than a second gain provided by the Kp_Cal Path 152.

The gain effectuated by the Kp_Cal Path 152, which is separate from the gain effectuated by the P-Path 140, can thereby result in pulses that may be subsequently converted into amplitudes (e.g., voltage amplitudes) by circuitry such as the LC VCO 134 of FIG. 1. In some embodiments, the separation of the P-Path 140 and the Kp_Cal Path 152 can be implemented such that the control of the LC VCO 134 by the Kp_Cal Path 152 can be more finely tuned. For example, the Kp_Cal Path 152 can output pulses representative of a gain, which can be based on the loop gain 304, such that the gain of the LC VCO 134 can be adjusted, changed, and/or modified for improved operation of the PLL 100 of FIG. 1.

Figure 4:
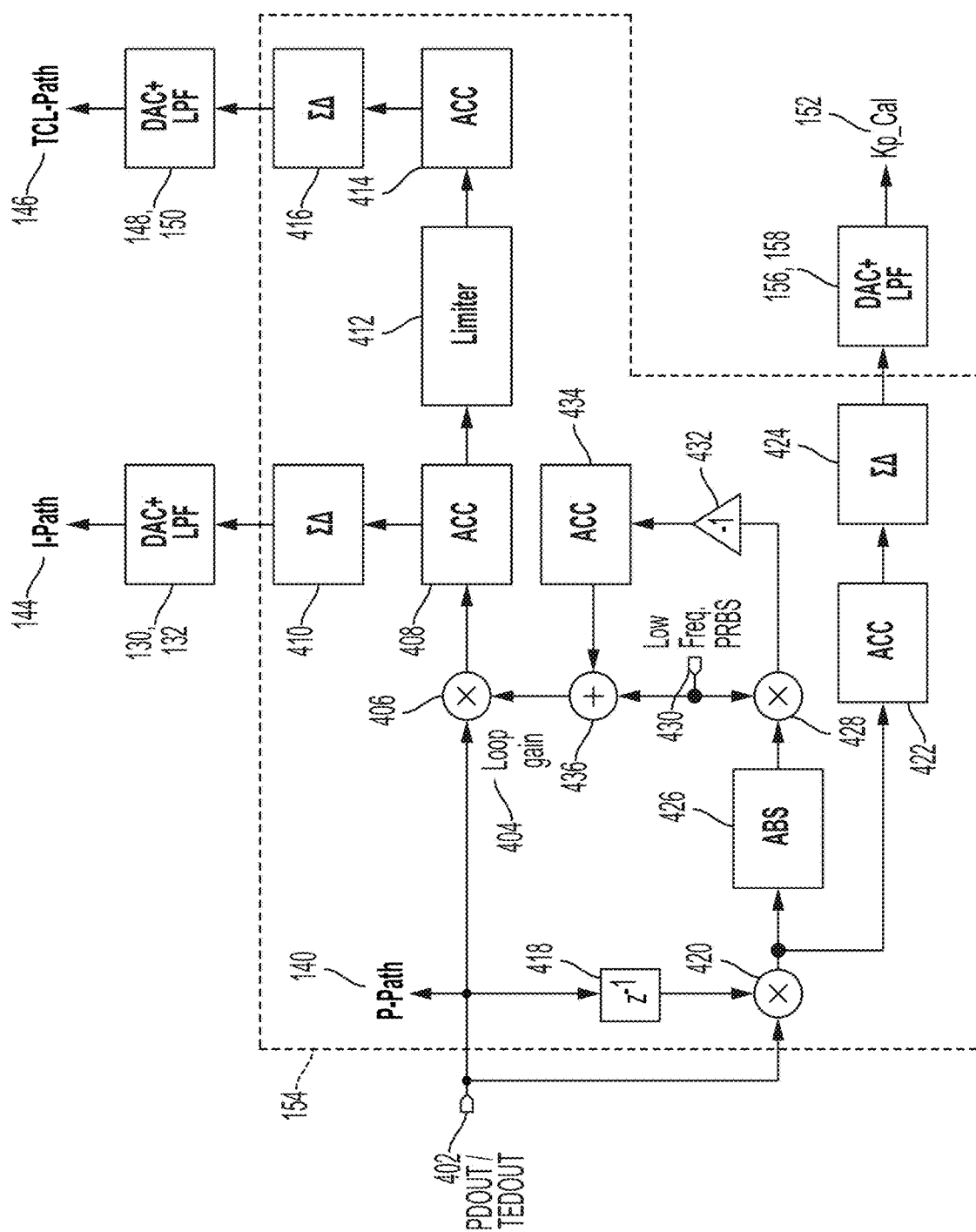
FIG. 4 depicts a schematic illustration of an example portion of the phase-locked loop of FIG. 1 and yet another example implementation of the phase-locked loop calibrator of FIG. 1.

FIG. 4 depicts a schematic illustration of an example portion of the PLL 100 of FIG. 1 and yet another example implementation of the PLL calibrator 154 of FIG. 1. In the illustrated example, the PLL calibrator 154 can be configured to receive a signal from a first input/output (I/O) port 402 identified by PDOUT/TEDOUT. For example, the first I/O port 402 can be configured to receive an output signal, such as a first output (TEDOUT) from a timing error detector (TED) and/or a second output (PDOUT) from a phase detector, such as the PD 122 of FIG. 1.

The PLL calibrator 154 of this example is coupled to an I-Path, a P-Path, a TCL-Path, and a Kp_Cal Path, which can be the I-Path 144, the P-Path 140, the TCL-Path 146, and the Kp_Cal Path 152, respectively, of FIG. 1. For example, the first I/O port 402 is coupled to the P-Path 140 of FIG. 1. The first I/O port 402 is coupled to a first multiplier 406, which can be configured to multiply the output signal from the first I/O port 402 and a signal representative of the loop gain 404. The output from the first multiplier 406 is provided to a first accumulator 408, which can be configured to store the output. The first accumulator 408 is coupled to a first sigma-delta modulator 410 (identified by ΣΔ). The first sigma-delta modulator 410 is coupled to the first DAC 130 and the first LPF 132 of the I-Path 144.

The first accumulator 408 of this example is coupled to a limiter 412, which can be configured to limit and/or prevent the stored value from the first accumulator 408 from exceeding a specified and/or pre-defined value. The limiter 412 is coupled to a second accumulator 414, which can be configured to store the limited value. The second accumulator 414 is coupled to a second sigma-delta modulator 416 (identified by ΣΔ). The output of the second sigma-delta modulator 416 is coupled to the second DAC 148 and the second LPF 150 of the TCL-Path 146 of FIG. 1.

The output signal from the first I/O port 402 is coupled to a delay element 418 (identified by $z^{-1}$) and a second multiplier 420. The delay element 418 can be configured to delay the output signal from the first I/O port 402 by at least one sample. For example, the second multiplier 420 can be configured to multiply the output signal from the first I/O port 402 by a delayed version of itself. In some embodiments, the delay element 418 and/or the second multiplier 420 can implement the autocorrelation logic 212 of FIG. 2 and/or the autocorrelation logic 310 of FIG. 3. For example, the delay element 418 and/or the second multiplier 420 can be configured to determine a correlation of the output signal from the first I/O port 402 with itself, such as a time delayed version of the output signal.

The second multiplier 420 can be configured to output the multiplied signal (e.g., a delayed output signal) to a third accumulator 422, which can store a value corresponding to the multiplied signal. The third accumulator 422 can be configured to output the stored value to a third sigma-delta modulator 424 (identified by ΣΔ). The third sigma-delta modulator 424 can be configured to modulate a signal corresponding to the stored value and output the modulated signal to the third DAC 156 and the third LPF 158 of the Kp_Cal Path 152 of FIG. 1.

In the illustrated example, the delayed output signal from the second multiplier 420 is provided to absolute value determination logic 426 (identified by ABS), which can be configured to determine an absolute value of the autocorrelation value from the second multiplier 420. The absolute value determination logic 426 can output the absolute value of the autocorrelation value to a third multiplier 428, which can be configured to multiply the absolute value of the autocorrelation value and a PRBS signal (identified by LOW FREQ PRBS) from a second I/O port 430 to generate a first output signal. For example, the PRBS signal can be implemented by and/or correspond to the PRBS signal 176 of FIG. 1. In some embodiments, the PRBS signal can be either a −1 or a +1 signal such that the third multiplier 428 can change a sign of the absolute value of the autocorrelation value in a pseudorandom manner.

The third multiplier 428 is coupled to an input of a fourth multiplier 432. The fourth multiplier 432 can be configured to multiply the first output signal from the third multiplier 428 by an integer to generate a second output signal. In the illustrated example, the integer is −1. Alternatively, the fourth multiplier 432 can be configured to multiply the first output signal via any other integer (e.g., −3, −2, 0, +1, +2, etc.).

The fourth multiplier 432 of the illustrated example is coupled to an input of a fourth accumulator 434 (identified by ACC), which can be configured to store a value representative of the second output signal from the fourth multiplier 432. The fourth accumulator 434 can be configured to output the value to an adder 436. The adder 436 can be configured to determine a combination, such as a sum, of the stored value from the fourth accumulator 434 and a value representative of the PRBS signal (e.g., −1 or +1).

In the illustrated example, the adder 436 and/or, more generally, the PLL calibrator 154, can calculate and/or determine the loop gain 404 based on a combination, such as a sum, of the stored value from the second accumulator 220 and the value representative of the PRBS signal. For example, the adder 436 can be configured to cause the injection of a perturbation from the PRBS generator 174 of FIG. 1 such that the absolute value of the autocorrelation value can alternate in values (e.g., if the absolute value of the autocorrelation value is +6, then the injected perturbation can change the value thereof to be +5 or +7).

The first multiplier 406 of this example can adjust, change, and/or modify the gain effectuated by the I-Path 144 and/or the TCL-Path 146 by multiplying the output signal from the first I/O port 402 and the loop gain 404. The gain effectuated by the I-Path 144 and/or the TCL-Path 146 can thereby result in pulses that may be subsequently converted into amplitudes (e.g., voltage amplitudes) by circuitry such as the LC VCO 134 of FIG. 1. For example, the I-Path 144 can output pulses representative of a gain, which can be based on the loop gain 404, such that the gain of the LC VCO 134 can be adjusted, changed, and/or modified for improved operation of the PLL 100 of FIG. 1. Additionally or alternatively, the TCL-Path 146 can output pulses representative of a gain, which can be based on the loop gain 404, such that the gain of the LC VCO 134 can be adjusted, changed, and/or modified for improved operation of the PLL 100 of FIG. 1

Figure 5A:
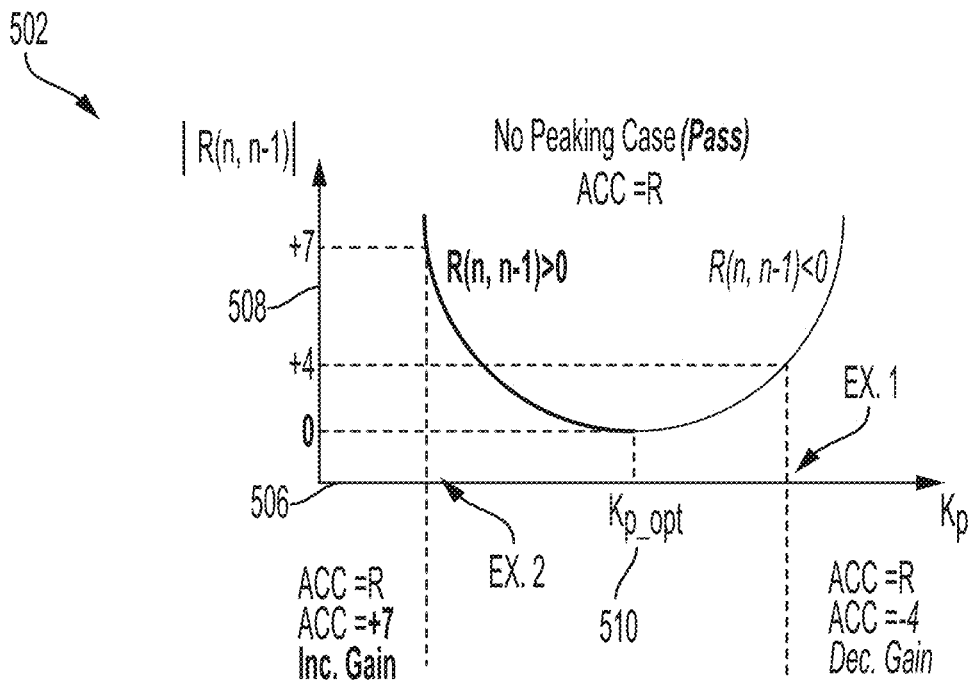
FIGS. 5A and 5B depict plots for a conventional technique for determining a loop gain and an example technique for determining a loop gain, respectively, for a phase-locked loop application.
Figure 5B:
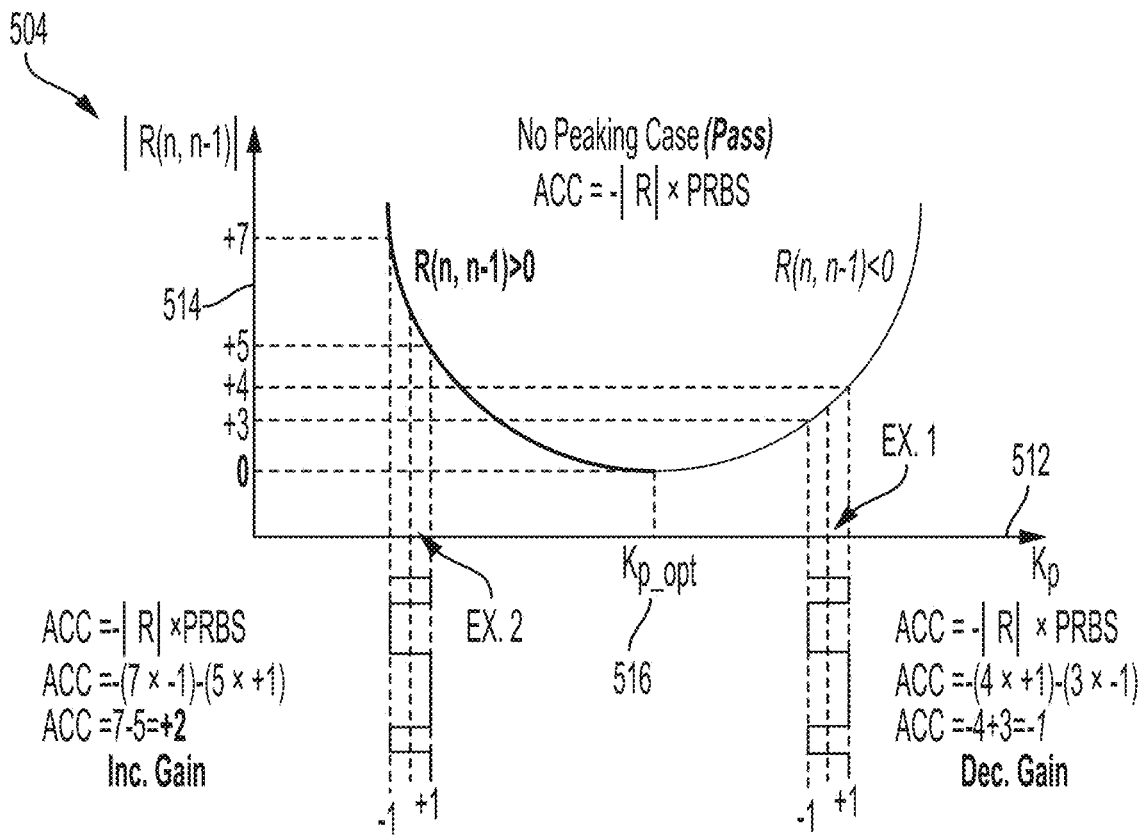

FIG. 5A depicts a first plot 502 representative of a conventional technique for determining a loop gain for a PLL application. FIG. 5B depicts a second plot 504 representative of an example technique for determining a loop gain for a PLL application. The plots 502, 504 are representative of an example in which a PLL may be used for a non-clock data recovery application. In such an example, noise in the PLL does not peak and/or spike such that autocorrelation is not always positive.

In the illustrated example of FIG. 5A, the first plot 502 has an x-axis 506 representative of a gain, such as a loop gain, of a PLL. The first plot 502 has a y-axis 508 representative of an absolute value of an autocorrelation value (identified by |R(n, n−1)|). In a first example (identified by EX. 1), if the autocorrelation value for the PLL is negative, a determination is made to decrease the gain by −4 (as an example) to approach an optimal gain 510 (identified by $K_{p\_opt}$). For example, a negative autocorrelation value can indicate that too large of a loop gain was applied such that subsequent samples have opposite polarity.

In a second example (identified by EX. 2), if the autocorrelation value for the PLL is positive, a determination is made to increase the gain by +7 (as an example) to approach the optimal gain 510 (identified by $K_{p\_opt}$). For example, a positive autocorrelation value can indicate that too small of a loop gain was applied such that subsequent samples have the same polarity. The first plot 502 depicts acceptable operation (identified by PASS) because determinations are made to decrease the gain when the autocorrelation is negative and increase the gain when the autocorrelation is positive.

Turning to the illustrated example of FIG. 5B, the second plot 504 has an x-axis 512 representative of a gain, such as a loop gain, of an example PLL, such as the PLL 100 of FIG. 1. The second plot 504 has a y-axis 514 representative of an absolute value of an autocorrelation value (identified by |R(n, n−1)|).

In a first example (identified by EX. 1), if the autocorrelation value for the PLL 100 is negative, the PLL calibrator 154 can determine to decrease the gain by −1 (as an example) to approach an optimal gain 516 (identified by $K_{p\_opt}$). For example, the output of the autocorrelation logic 212 can be R, the output of the absolute value determination logic 214 can be |R|, the output of the second multiplier 216 can be |R|×PRBS|, and the output of the third multiplier 218 can be −|R|×PRBS. In some embodiments, a stored value of the second accumulator 220 can be −1, which can be derived as shown in FIG. 5B. In some embodiments, the second accumulator 220 can output −1 as the loop gain 204 of FIG. 2.

In a second example (identified by EX. 2), if the autocorrelation value for the PLL 100 is positive, the PLL calibrator 154 can determine to increase the gain by +2 (as an example) to approach the optimal gain 516. For example, the output of the autocorrelation logic 212 can be R, the output of the absolute value determination logic 214 can be |R|, the output of the second multiplier 216 can be |R|×PRBS|, and the output of the third multiplier 218 can be −|R|×PRBS. In some embodiments, a stored value of the second accumulator 220 can be +2, which can be derived as shown in FIG. 5B. In some embodiments, the second accumulator 220 can output +2 as the loop gain 204 of FIG. 2. The second plot 504 depicts acceptable operation (identified by PASS) of the PLL 100 because determinations are made to decrease the gain when the autocorrelation is negative and increase the gain when the autocorrelation is positive.

Figure 6A:
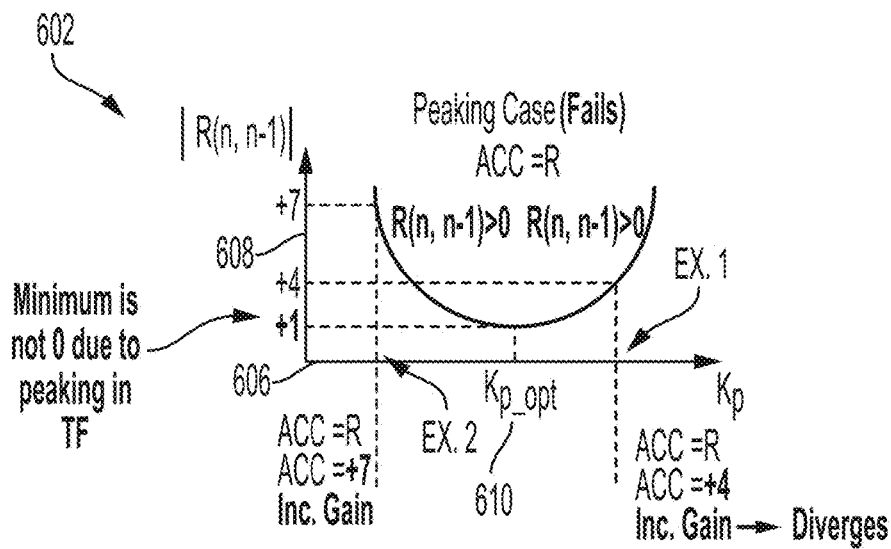
FIGS. 6A and 6B depict plots for a conventional technique for determining a loop gain and an example technique for determining a loop gain, respectively, for a clock data recovery application.
Figure 6B:
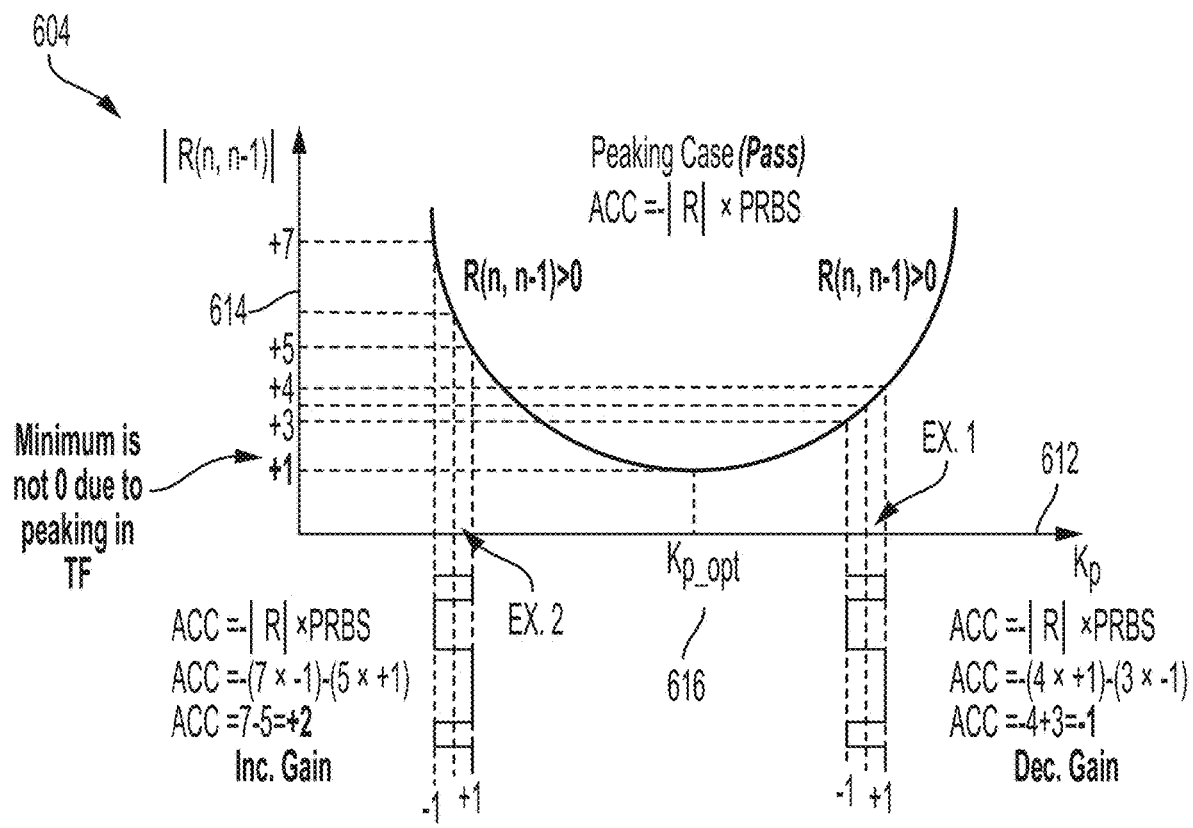

FIG. 6A depicts a first plot 602 representative of a conventional technique for determining a loop gain for a clock data recovery application. FIG. 6B depicts a second plot 604 representative of an example technique for determining a loop gain for a clock data recovery application. The plots 602, 604 are representative of an example in which a PLL may be used for a clock data recovery application in which noise in the PLL can peak and/or spike such that a floor of potential autocorrelation values is raised. For example, the floor of potential autocorrelation values in FIGS. 5A and 5B is 0 while the floor of potential autocorrelation values in FIGS. 6A and 6B is 1 due to the increased noise generated by the clock data recovery application. Because of the peak and/or spike in noise, the autocorrelation is always positive.

In the illustrated example of FIG. 6A, the first plot 602 has an x-axis 606 representative of a gain, such as a loop gain, of a PLL. The first plot 602 has a y-axis 608 representative of an absolute value of an autocorrelation value (identified by |R(n, n−1)|). In a first example (identified by EX. 1) and a second example (identified by EX. 2), the determination is always to increase the gain of the PLL because the autocorrelation value for the PLL is positive. Because the gain is always increased, an optimal gain 610 is not approached and the illustrated example of FIG. 6A depicts erroneous PLL operation (identified by FAILS).

Turning to the illustrated example of FIG. 6B, the second plot 604 has an x-axis 612 representative of a gain, such as a loop gain, of an example PLL, such as the PLL 100 of FIG. 1. The second plot 604 has a y-axis 614 representative of an absolute value of an autocorrelation value (identified by |R(n, n−1)|).

In a first example (identified by EX. 1) and a second example (identified by EX. 2), the PLL calibrator 154 can determine to decrease the gain by −1 (as an example) to approach an optimal gain 616 (identified by $K_{p\_opt}$) or increase the gain by +2 to approach the optimal gain 616. Beneficially, the PRBS signal as disclosed herein can alternate the sign of the autocorrelation value such that the correct direction can be identified to minimize and/or otherwise reduce the absolute value of the autocorrelation value. For example, the output of the autocorrelation logic 212 can be R, the output of the absolute value determination logic 214 can be |R|, the output of the second multiplier 216 can be |R|×PRBS|, and the output of the third multiplier 218 can be −|R|×PRBS. In some embodiments, a stored value of the second accumulator 220 can be −1 or +2, either of which can be derived as shown in FIG. 6B. In some embodiments, the second accumulator 220 can output −1 or +2 as the loop gain 204 of FIG. 2.

The second plot 604 depicts acceptable operation (identified by PASS) of the PLL 100 because the correct direction is determined using the PRBS signal such that determinations are made to either decrease or increase the gain in examples in which the autocorrelation is always positive, such as clock data recovery applications. Beneficially, the second plot 604 depicts improved operation over the conventional technique shown in FIG. 6A, which causes diverging of the loop gain determination with respect to autocorrelation.

Figure 7A:
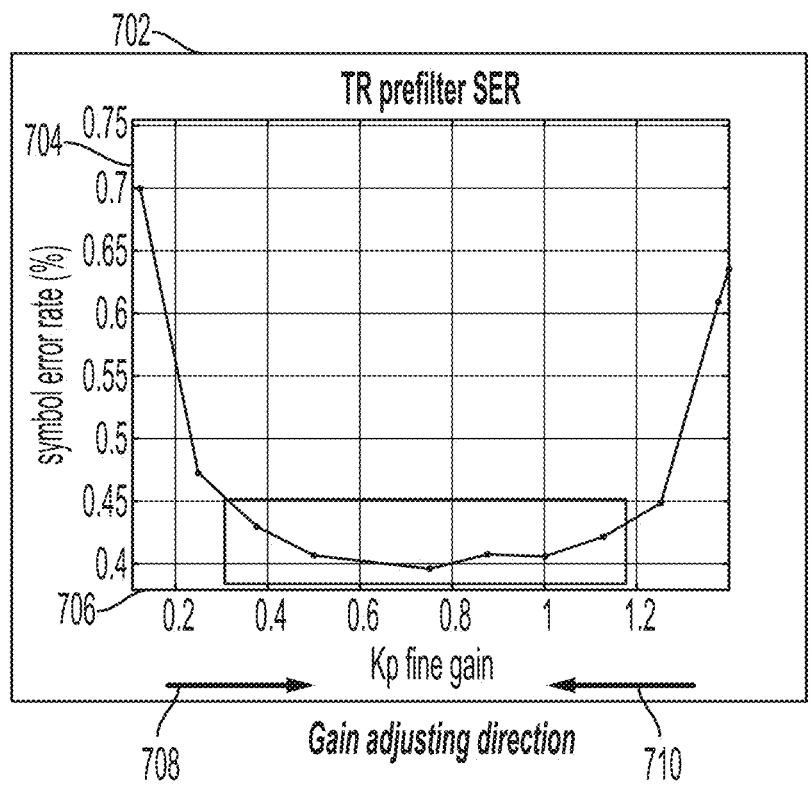
FIG. 7A depicts a plot representative of symbol error rate with respect to loop gain, according to some embodiments.

FIG. 7A depicts a plot 702 representative of symbol error rate (SER), shown by y-axis 704, with respect to loop gain, shown by x-axis 706, according to some embodiments. For example, the plot 702 can be representative of operation of the PLL 100 of FIG. 1, or portion(s) thereof, to control the LC VCO 134 of FIG. 1 using a loop gain determined based at least in part by the PRBS signal 176 of FIG. 1. Beneficially, the PLL 100 can be operated using example techniques disclosed herein to achieve a reduced SER. For example, the PLL calibrator 154 can increase the loop gain as indicated by a first arrow 708 or decrease the loop gain as indicated by a second arrow 710 to approach an optimal gain such that SER approaches a minimum.

Figure 7B:
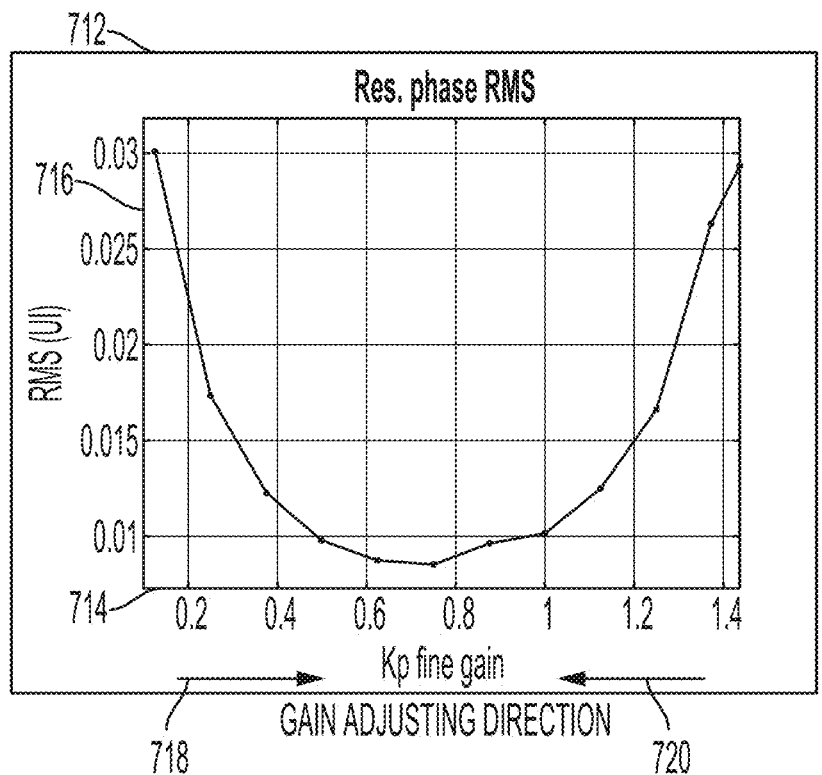
FIG. 7B depicts a plot representative of timing error with respect to loop gain, according to some embodiments.

FIG. 7B depicts a plot 712 representative of timing error with respect to loop gain, according to some embodiments. In FIG. 7B, the loop gain is represented by an x-axis 714. In FIG. 7B, the timing error is a represented by a y-axis 716 and is a root-mean-square (RMS) in unit intervals (UI). For example, the plot 712 can illustrate how much error there may be in the PLL 100 of FIG. 1 when effectuating a clock data recovery application. Beneficially, the PLL 100 can be operated using example techniques disclosed herein to achieve a reduced timing error. For example, the PLL calibrator 154 can increase the loop gain as indicated by a first arrow 718 or decrease the loop gain as indicated by a second arrow 720 to approach an optimal gain such that the timing error approaches a minimum.

Figure 8:
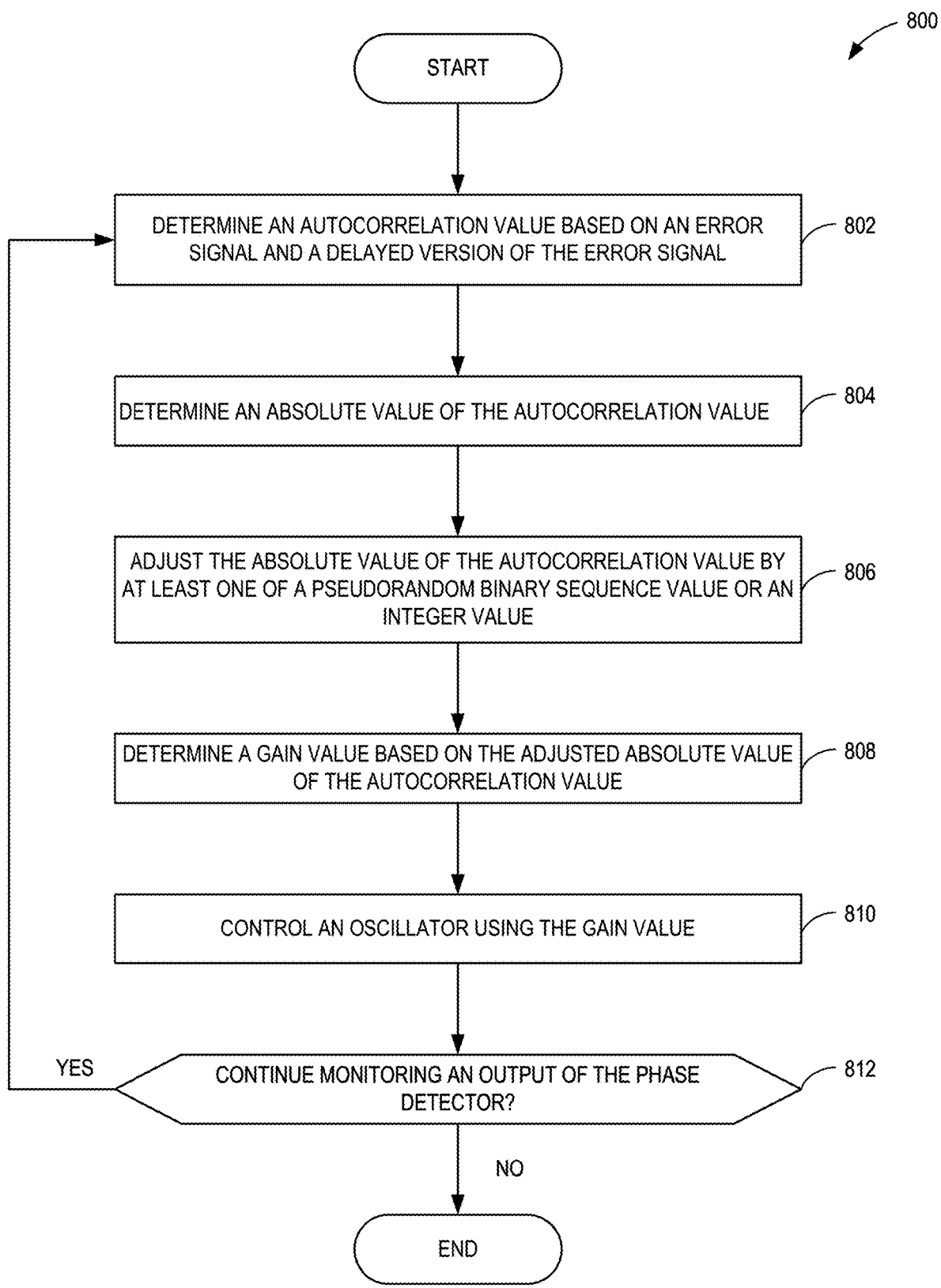
FIG. 8 is a flowchart representative of an example process that may be performed and/or implemented using hardware logic or machine-readable instructions that may be executed by processor circuitry to implement the phase-locked loop calibrator of FIGS. 1, 2, 3, and/or 4.

FIG. 8 is a flowchart representative of an example process 800 that may be performed and/or implemented using hardware logic to implement the PLL calibrator 154 of FIGS. 1, 2, 3, and/or 4, and/or, more generally, the PLL 100 of FIG. 1. In some embodiments, the process 800 may be performed by processor circuitry executing machine-readable instructions to implement the PLL calibrator 154 of FIGS. 1, 2, 3, and/or 4, and/or, more generally, the PLL 100 of FIG. 1. Additionally or alternatively, block(s) of the flowchart of FIG. 8 may be representative of state(s) of one or more hardware-implemented state machines, algorithm(s) that may be implemented by hardware alone such as an ASIC, etc., and/or any combination(s) thereof.

The process 800 of FIG. 8 begins at block 802, at which the PLL 100 of FIG. 1 may determine an autocorrelation value based on an error signal and a delayed version of the error signal. For example, the autocorrelation logic 212 may determine an autocorrelation value based on the output signal from the first I/O port 202 and a delayed version of the output signal.

At block 804, the PLL 100 may determine an absolute value of the autocorrelation value. For example, the absolute value determination logic 214 may determine an absolute value of the autocorrelation value from the autocorrelation logic 212.

At block 806, the PLL 100 may adjust the absolute value of the autocorrelation value by at least one of a pseudorandom binary sequence value or an integer value. For example, the second multiplier 216 may adjust the absolute value by multiplying the absolute value by the PRBS signal from the second I/O port 224. In some embodiments, the third multiplier 218 may adjust the output from the second multiplier 216 by an integer.

At block 808, the PLL 100 may determine a gain value based on the adjusted absolute value of the autocorrelation value. For example, the adder 222 may determine the loop gain 204 based on a combination of the PRBS signal and the stored value from the second accumulator 220.

At block 810, the PLL 100 may control an oscillator using the gain value. For example, the first multiplier 210 may adjust the gain implemented by the P-Path 140 by the loop gain 204 such that the LC VCO 134 can be controlled at least in part by the loop gain 204.

At block 812, the PLL 100 determines whether to continue monitoring an output of the phase detector. For example, the PLL calibrator 154 can determine (e.g., iteratively determine) the loop gain 204 in response to output(s) from the first I/O port 202. If, at block 812, the PLL 100 determines to continue monitoring an output of the phase detector, control returns to block 802. Otherwise, the example process 800 of FIG. 8 concludes.

Embodiments have been described where the techniques are implemented in circuitry and/or machine-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The phrase "and/or," as used herein in the specification and in the claims, should be understood to mean "either or both," of the elements so conjoined, e.g., elements that are conjunctively present in some cases and disjunctively present in other cases. Multiple elements listed with "and/or" should be construed in the same fashion, e.g., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The indefinite articles "a" and "an," as used herein in the specification and in the claims, unless clearly indicated to the contrary, should be understood to mean "at least one."

As used herein in the specification and in the claims, the phrase, "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently, "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The word "exemplary" is used herein to mean serving as an example, instance, or illustration. Any embodiment, implementation, process, feature, etc., described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. An apparatus for loop gain calibration, comprising:
   a phase detector with a phase detector output and configured to generate an error signal representative of a difference between an input signal and a feedback signal; and
   a calibrator circuit with a calibrator input coupled to the phase detector output and configured to:
      determine a correlation value associated with the error signal; and
      determine a gain value based on an adjustment of an absolute value of the correlation value by a pseudorandom binary sequence signal.

2. The apparatus of claim 1, wherein the correlation value is an autocorrelation value.

3. The apparatus of claim 1, wherein the calibrator circuit comprises:
   an autocorrelation circuit with an autocorrelation input and an autocorrelation output, the autocorrelation input is configured to receive the error signal, and the autocorrelation circuit is configured to determine the correlation value;
   an absolute value circuit with an absolute value input and an absolute value output, the absolute value input is coupled to the autocorrelation output; and
   a multiplier circuit with a first multiplier input and a second multiplier input, the first multiplier input is configured to receive a first signal representative of the absolute value of the correlation value, the second multiplier input is configured to receive the pseudorandom binary sequence signal, and the multiplier circuit is configured to multiply the first signal by the pseudorandom binary sequence signal to generate an output signal.

4. The apparatus of claim 3, wherein the multiplier circuit is a first multiplier circuit, the output signal is a first output signal, and the calibrator circuit comprises:
   a second multiplier circuit with a third multiplier input and a third multiplier output, the third multiplier input is coupled to a first multiplier output of the first multiplier circuit, and the second multiplier circuit is configured to multiply the output signal by an integer to generate a second output signal;
   an accumulator circuit with an accumulator input and an accumulator output, the accumulator input is coupled to the third multiplier output, and the accumulator circuit is configured to store a data value representative of the second output signal; and an adder circuit with a first adder input, a second adder input, and an adder output, the first adder input is configured to receive the pseudorandom binary sequence signal, the second adder input is coupled to the accumulator output, and the adder output is configured to determine a combination of the data value and a pseudorandom binary sequence value representative of the pseudorandom binary sequence signal.

5. The apparatus of claim 4, further comprising a third multiplier circuit with a fourth multiplier input and a fifth multiplier input, the fourth multiplier input is coupled to the phase detector output and configured to receive the error signal, the fifth multiplier input is coupled to the adder output and configured to receive a gain signal representative of the gain value, and the third multiplier circuit is configured to perform a multiplication of the error signal and the gain signal to generate a control signal.

6. The apparatus of claim 4, wherein the calibrator circuit comprises a sigma-delta modulation circuit with a modulation input and a modulation output, the modulation input is coupled to the adder output.

7. The apparatus of claim 1, wherein the calibrator circuit has a calibrator output, and the apparatus further comprising:
a digital-to-analog converter (DAC) with a DAC input and a DAC output, the DAC input is coupled to the calibrator output;
a filter with a filter input and a filter output, the filter input is coupled to the DAC output; and
an oscillator with an oscillator input is coupled to the filter output and configured to be controlled by a control signal adjusted by the gain value.

8. The apparatus of claim 7, wherein the oscillator has an oscillator output, and the apparatus further comprising:
a buffer with a buffer input and a buffer output, the buffer input is coupled to the oscillator output; and
a clock generator with a clock generator input, the clock generator input is coupled to the buffer output, and the clock generator is configured to generate an output clock signal.

9. The apparatus of claim 7, wherein the filter is a low-pass filter and the oscillator is a voltage-controlled oscillator.

10. The apparatus of claim 1, further comprising:
a digital loop filter with a digital loop filter input and a digital loop filter output, the digital loop filter input is coupled to the phase detector output;
a digital-to-analog converter (DAC) with a DAC input and a DAC output, the DAC input is coupled to the digital loop filter output;
a low-pass filter with a low-pass filter input and a low-pass filter output, the low-pass filter input is coupled to the DAC output; and
an oscillator with an oscillator input coupled to the low-pass filter output.

11. The apparatus of claim 1, further comprising:
a signal conditioning circuit with a signal conditioning input and a signal conditioning output, the signal conditioning input is coupled to the phase detector output; and
an oscillator input coupled to the signal conditioning output.

12. The apparatus of claim 1, wherein the correlation value is an autocorrelation value, and the calibrator circuit is configured to:
determine that the autocorrelation value is a positive value; and
determine the gain value to increase a gain of the phase detector.

13. The apparatus of claim 1, wherein the correlation value is an autocorrelation value, and the calibrator circuit is configured to:
determine that the autocorrelation value is a negative value; and
determine the gain value to decrease a gain of the phase detector.

14. The apparatus of claim 1, wherein the phase detector is a timing error detector.

15. The apparatus of claim 1, wherein the phase detector is a time-to-digital converter.

16. The apparatus of claim 1, wherein the apparatus comprises a phase-locked loop, and the phase-locked loop comprises a clock data recovery circuit.

17. A calibrator circuit for loop gain calibration, comprising:
a pseudorandom binary sequence generator with a pseudorandom binary sequence generator output and configured to generate a pseudorandom binary sequence signal;
a first multiplier circuit with a first multiplier input, a second multiplier input, and a first multiplier output, the first multiplier input is configured to receive a first signal representative of an absolute value of correlation value associated with an error signal, the second multiplier input is coupled to the pseudorandom binary sequence generator output, and the first multiplier circuit is configured to generate a second signal based on a multiplication of the first signal and the pseudorandom binary sequence signal; and
a second multiplier circuit with a third multiplier input coupled to the first multiplier output and configured to multiply the second signal by an integer to generate an output signal for generation of a gain signal, the gain signal to cause a reduction in the correlation value.

18. The calibrator circuit of claim 17, wherein the correlation value is an autocorrelation value, and further comprising:
an autocorrelation circuit with an autocorrelation input and an autocorrelation output, and the autocorrelation circuit is configured to:
receive the error signal; and
determine the autocorrelation value based on the error signal; and
an absolute value circuit with an absolute value input and an absolute value output, the absolute value input is coupled to the autocorrelation output, the absolute value output is coupled to the first multiplier input, and the absolute value circuit is configured to generate the first signal.

19. The calibrator circuit of claim 17, further comprising:
an accumulator circuit with an accumulator input and an accumulator output, the accumulator input is coupled to a second multiplier output of the second multiplier circuit, and the accumulator circuit is configured to store a data value representative of the output signal; and
an adder circuit with a first adder input and a second adder input, the first adder input is coupled to the pseudorandom binary sequence generator output and configured to receive the pseudorandom binary sequence signal, the second adder input is coupled to the accumulator output, and the adder circuit is configured to determine a combination of the data value and a pseudorandom binary sequence value representative of the pseudorandom binary sequence signal.

20. A method for loop gain calibration, comprising:

determining a correlation value based on an error signal and a delayed version of the error signal;

determining a gain value by adjusting an absolute value of the correlation value by at least one of a pseudorandom binary sequence value or an integer value; and controlling an oscillator using the gain value.

* * * * *